(12) United States Patent
Kamp et al.

(10) Patent No.: US 6,760,246 B1
(45) Date of Patent: Jul. 6, 2004

(54) METHOD OF WRITING FERROELECTRIC FIELD EFFECT TRANSISTOR

(75) Inventors: David A. Kamp, Monument, CO (US); Alan D. DeVilbiss, Colorado Springs, CO (US)

(73) Assignee: Celis Semiconductor Corporation, Colorado Springs, CO (US)

( * ) Notice: Subject to any disclaimer, the term of this patent is extended or adjusted under 35 U.S.C. 154(b) by 0 days.

(21) Appl. No.: 10/136,210

(22) Filed: May 1, 2002

(51) Int. Cl.[7] ............................................... G11C 11/22
(52) U.S. Cl. ...................................... 365/145; 365/65
(58) Field of Search .................................. 365/145, 65

(56) References Cited

U.S. PATENT DOCUMENTS

| | | | | |
|---|---|---|---|---|
| 5,723,885 A | * | 3/1998 | Ooishi | 257/295 |
| 6,091,621 A | * | 7/2000 | Wang et al. | 365/145 |
| 6,117,691 A | * | 9/2000 | Hsu et al. | 438/3 |
| 6,205,048 B1 | * | 3/2001 | Lee | 365/145 |

* cited by examiner

Primary Examiner—Hoai Ho
(74) Attorney, Agent, or Firm—Mark G. Pannell; Hanes & Schutz, P.C.

(57) ABSTRACT

A ferroelectric field effect transistor (FET) has a gate, source, drain, and substrate. A negative voltage is applied to the gate. Ground potential is applied to the source, drain, and substrate. The negative voltage has a magnitude at least equal to the coercive voltage of the FET. A positive voltage is then applied to the gate. Ground potential is applied to the source and substrate. The positive voltage is no less than the coercive voltage. Either a positive voltage or a ground potential is applied to the drain to write a logic state to the FET. A voltage is applied to the gate. Ground potential is applied to the source. A positive voltage is applied to the drain. The drain current is measured and compared to a compare current. The relative size of the drain current compared to the compare current is indicative of the stored logic state in the FET.

12 Claims, 15 Drawing Sheets

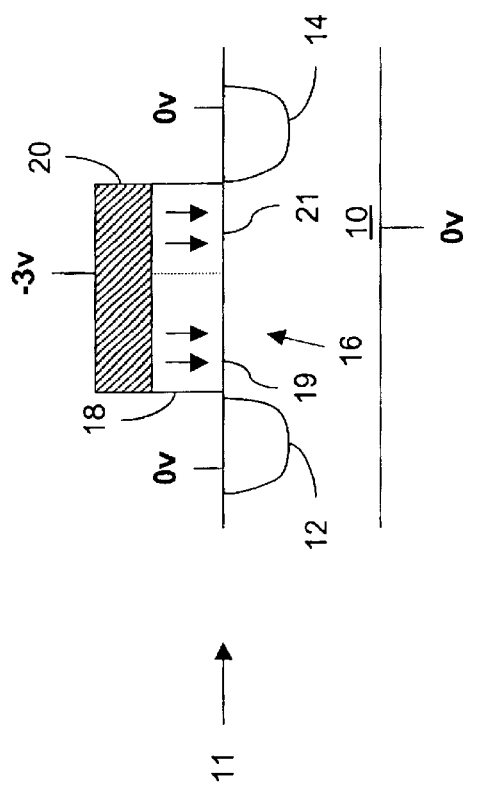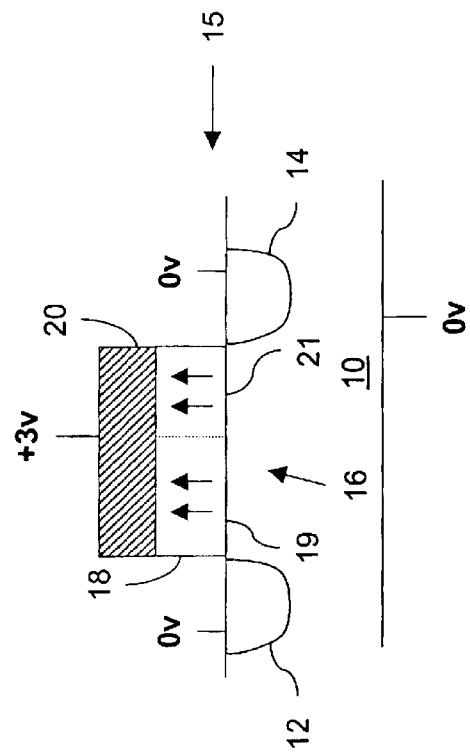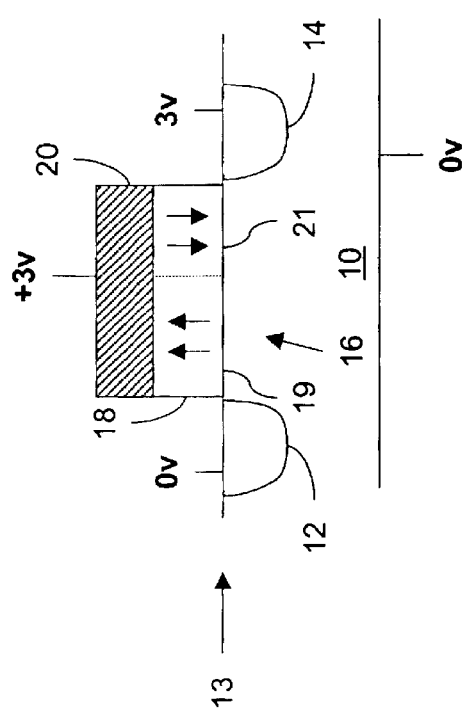

SELECTED WL

DE-SELECTED ROW

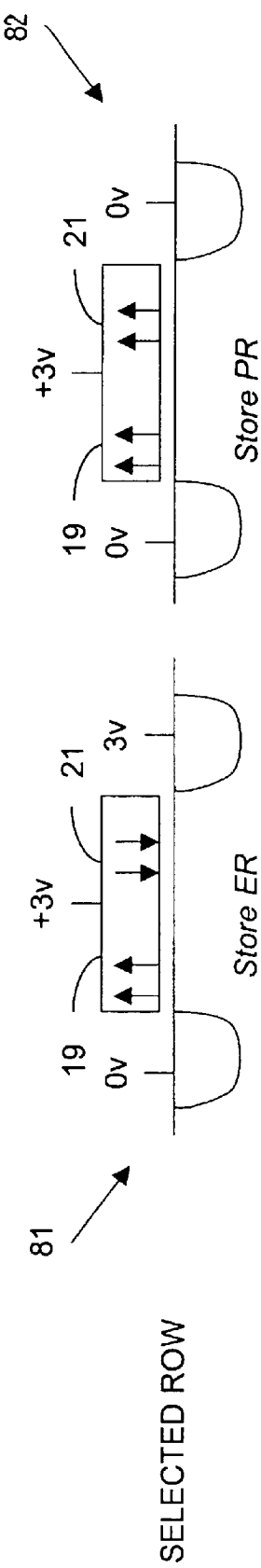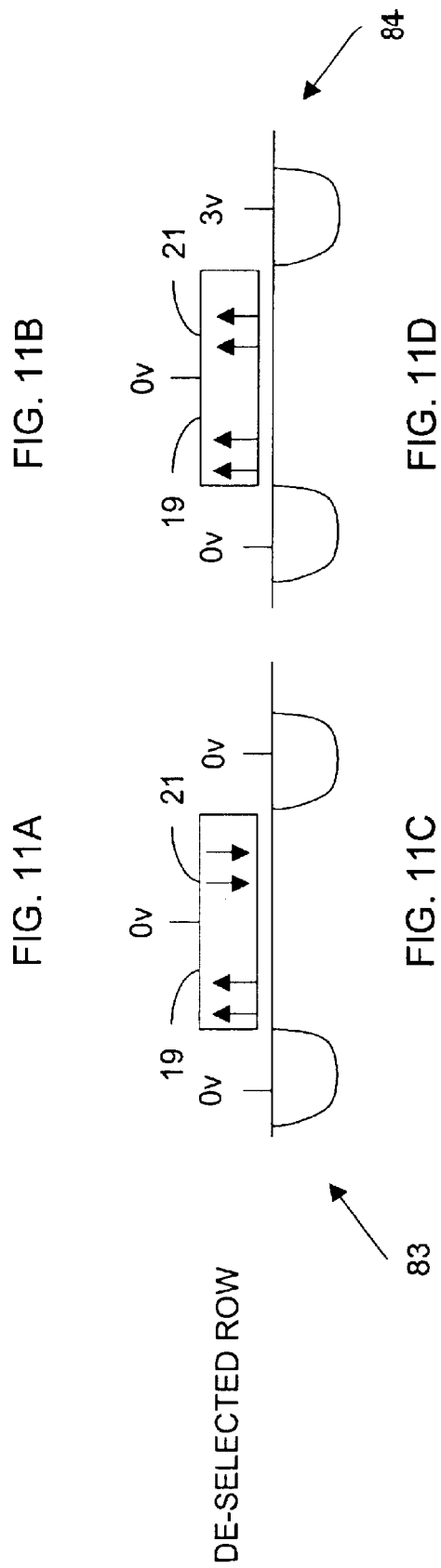

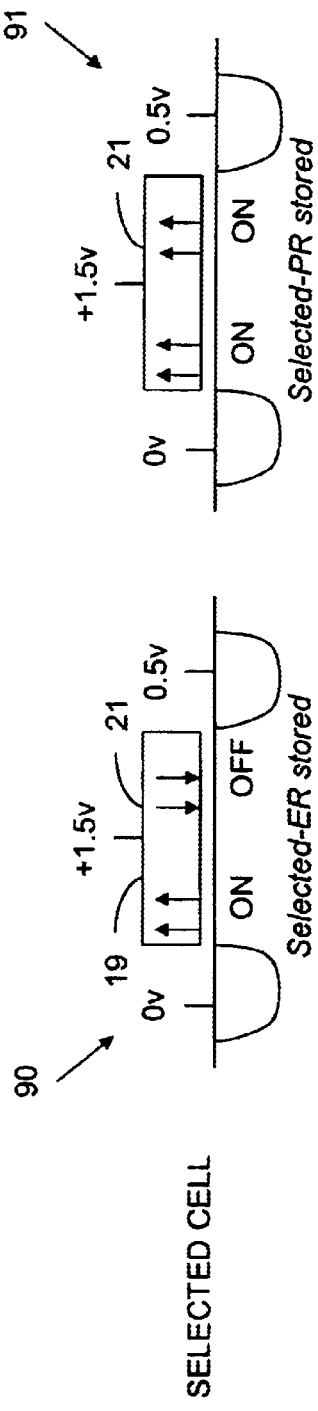
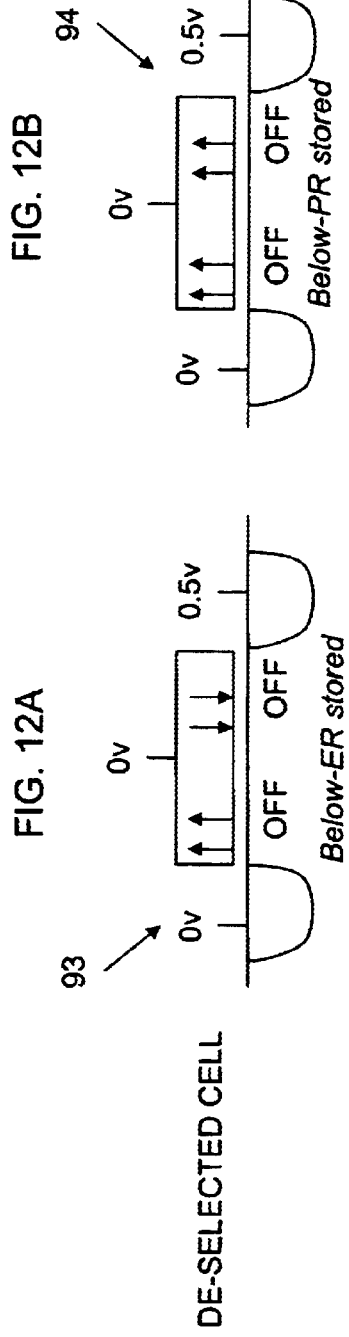
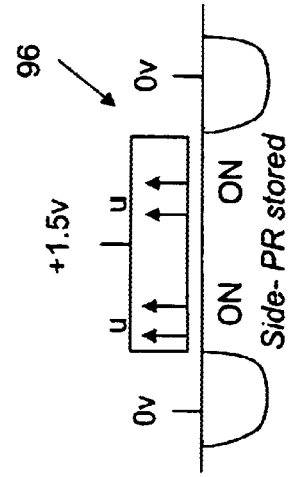
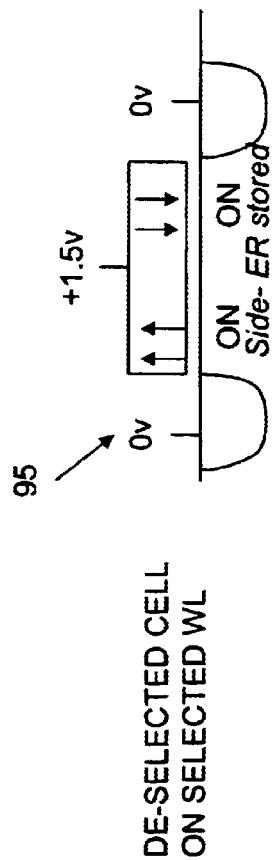

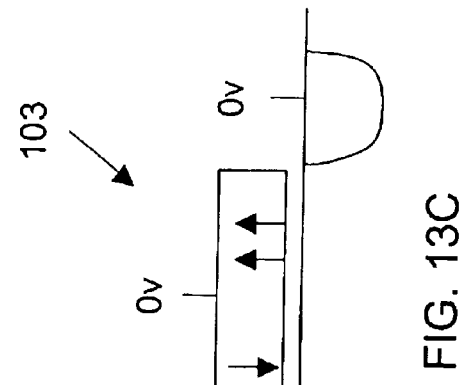
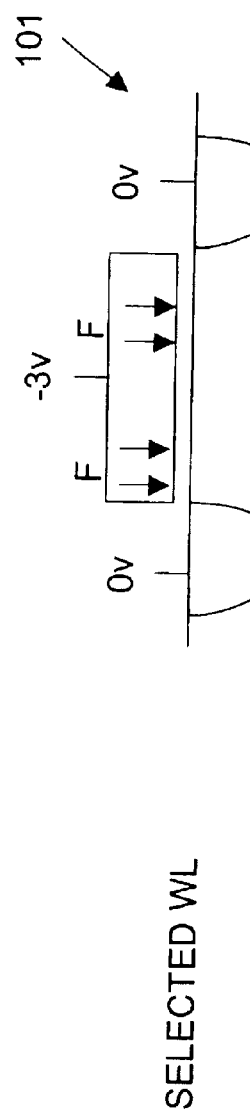
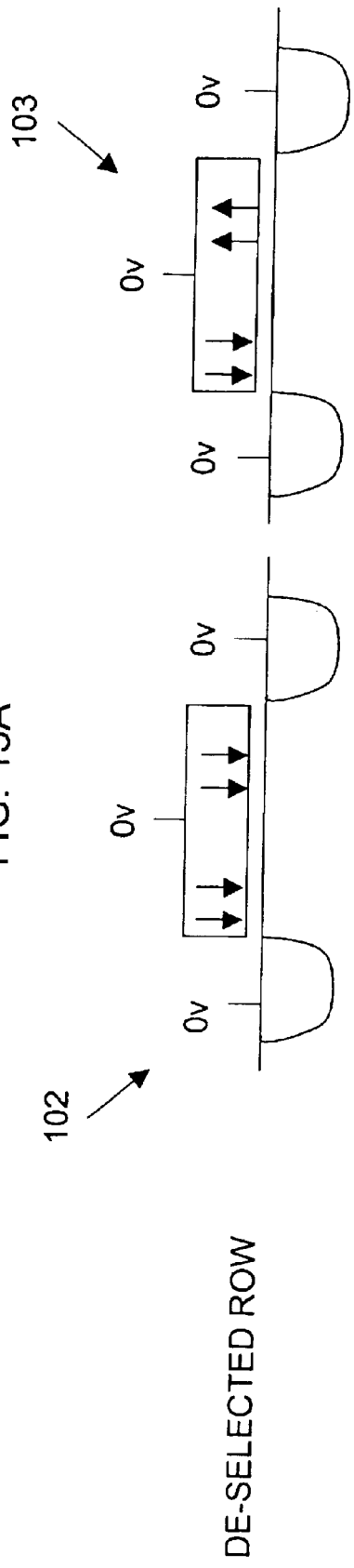
FIG. 13A
FIG. 13B
FIG. 13C
SELECTED WL
DE-SELECTED ROW

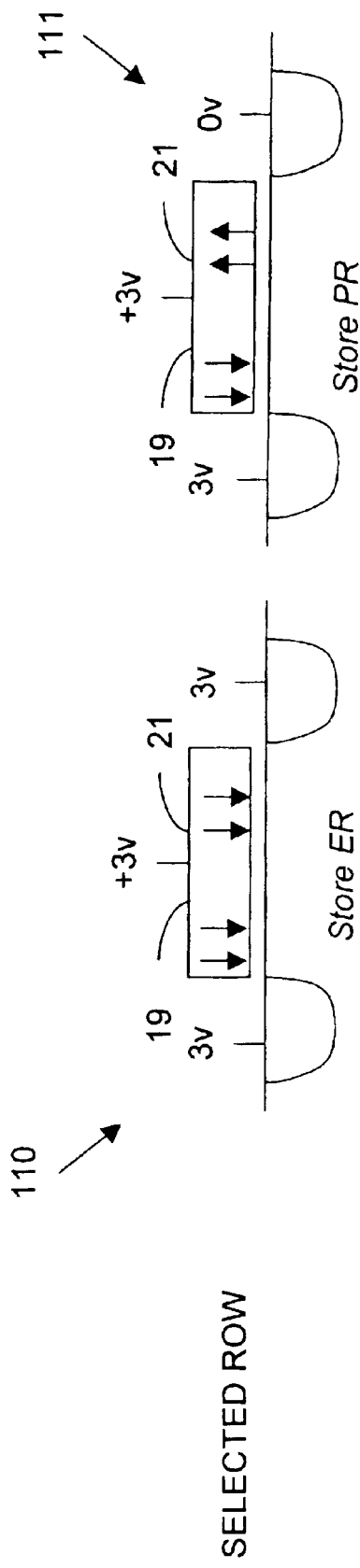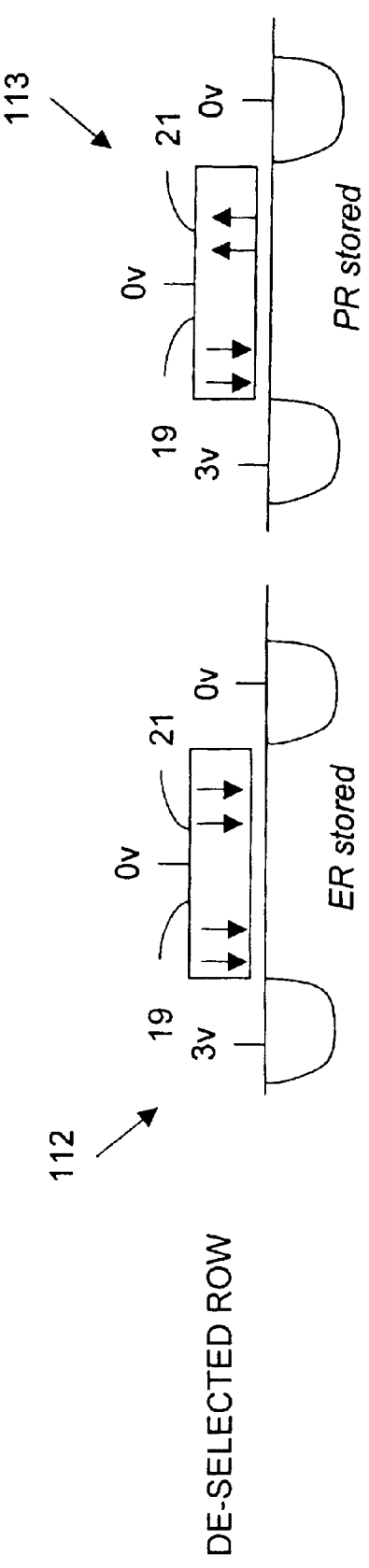

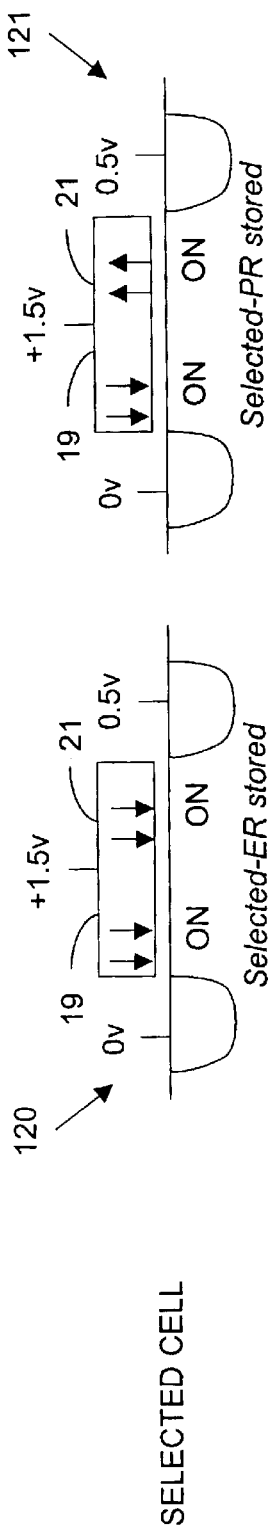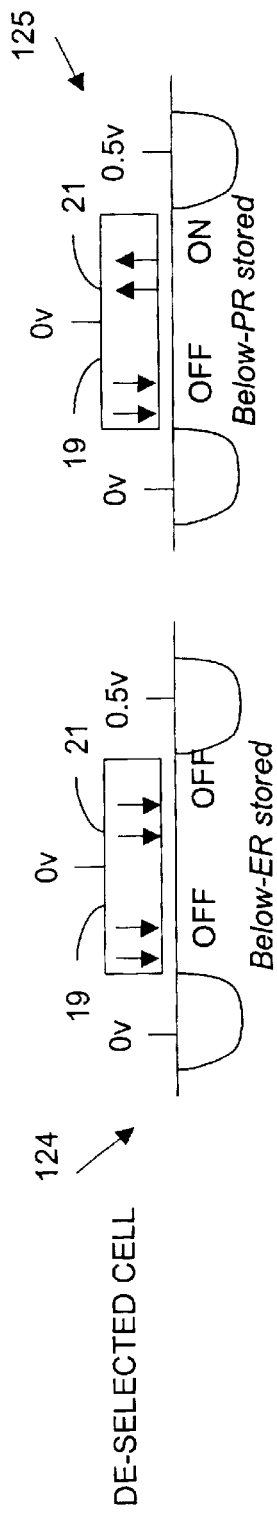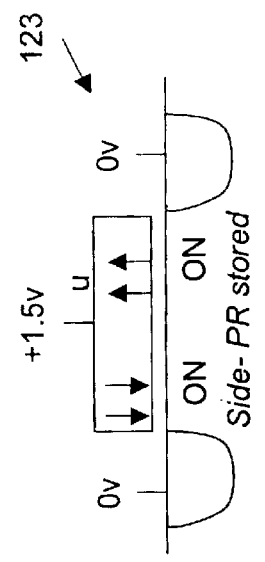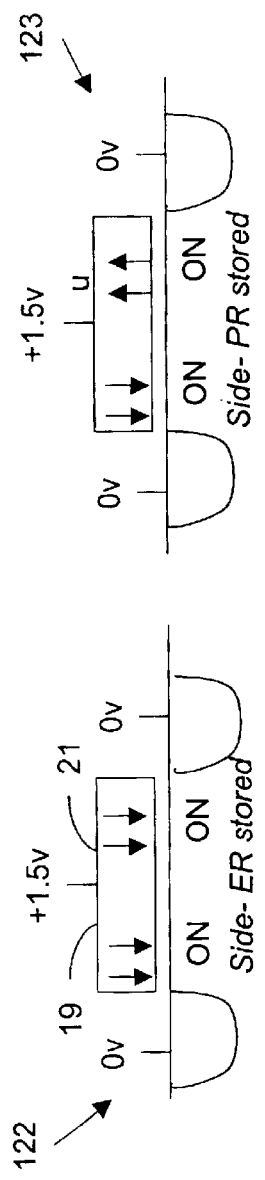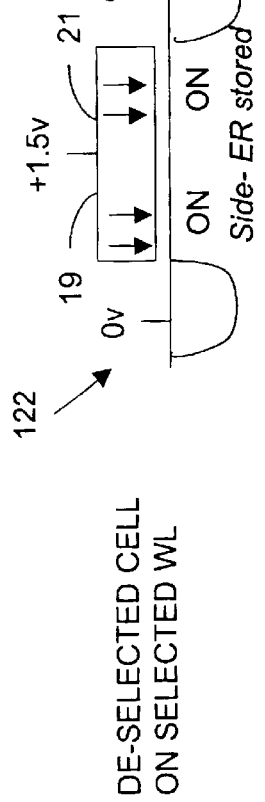

METHOD OF WRITING FERROELECTRIC FIELD EFFECT TRANSISTOR

FIELD OF THE INVENTION

This invention relates to integrated circuit transistors, and in particular to a ferroelectric field effect transistor (FET).

BACKGROUND OF THE INVENTION

Ferroelectric nonvolatile random access memory devices preserve the stored data state, even when the power supply signal is removed. The logic state of each memory cell generally is based on the electrical polarization of a ferroelectric capacitor, including a ferroelectric material sandwiched between two conductive or semi-conductive layers. When an electric field of sufficient magnitude is applied across the ferroelectric capacitor, the ferroelectric material will polarize in the direction of that electric field. The minimum voltage that must be applied across the capacitor in to order to initiate reversal of the polarization state is defined as the coercive voltage.

It is well known that direction of the polarization may be sensed by applying a voltage greater than the coercive voltage across a ferroelectric capacitor, and sensing the resulting current flow. If the polarity of the voltage applied is opposite to the polarization in a ferroelectric capacitor, the polarization of the ferroelectric capacitor will switch to the opposite state. If, on the other hand, the polarization in the ferroelectric capacitor is the same as the voltage applied, the ferroelectric capacitor will not switch polarization states. Since significantly more current results when a polarization switch occurs than when it does not, the resulting current can be used to determine the logic state of the ferroelectric capacitor. When reading is complete, the cells must be rewritten to their original logic states. This method is referred to as a "destructive read-out" since the data stored in the ferroelectric capacitor is temporarily overwritten.

Also known in the art are various "non-destructive read-out" sensing techniques wherein the polarization stored in the ferroelectric capacitor is sensed without disturbing or destroying the stored polarization state. Such methods are generally based on detecting the capacitance of the ferroelectric capacitor by applying voltages less than the coercive voltage across the terminals of the ferroelectric capacitor.

Ferroelectric memory cells based on sensing the state of polarization of a ferroelectric capacitor, whether sensed destructively or non-destructively, result in a memory cell that requires additional transistor devices for selection of a particular cell within the memory array. Ferroelectric memories based on a class of devices known as ferroelectric field effect transistors (FETs) could offer significant memory cell size advantages, thereby decreasing the manufacturing cost dramatically. A ferroelectric FET known in the prior art is structurally identical to a metal-oxide-silicon field effect transistor (MOSFET) device with the oxide replaced by a ferroelectric material, as shown in FIG. 1. The structure is constructed on p-type semiconductor substrate 10 with two regions of n-type regions forming source 12 and drain 14. Channel region 16 is disposed in the region between source 12 and drain 14. A ferroelectric layer 18 is formed on the surface of channel region 16. A conductive layer formed on the surface of ferroelectric 18 forms gate electrode 20.

In operation, a logic state is written into the ferroelectric FET by applying a voltage greater than the coercive voltage across the ferroelectric layer, thereby setting the state of polarization of that ferroelectric layer. After the write voltages are removed, the state of polarization of the ferroelectric layer gives rise to an electric field, which shifts the turn-on threshold voltage level of the ferroelectric FET. This principle is utilized to retrieve the logic state from the ferroelectric FET.

FIG. 2 illustrates one example of a voltage bias applied to source 12, drain 14, gate electrode 18, and substrate 10 in order to produce a polarization within the ferroelectric layer 18 corresponding to a first logic state as is known in the prior art. In this example, −3v is applied to gate electrode 20, and 0v is applied to source 12, drain 14, and substrate 16. Positive charges are attracted to channel 16 putting this device in "accumulation mode", thereby creating a potential in channel region 16 equal to the substrate voltage, which is biased to 0v. Assuming that the coercive voltage is 3v or less, the electric field thereby created across the ferroelectric will polarize the ferroelectric layer in the direction of that electric field. This electric field will have the effect of increasing the turn-on threshold voltage of the ferroelectric FET.

FIG. 3 illustrates one example of a voltage bias applied to source 12, drain 14, gate electrode 18, and substrate 10 in order to produce a polarization within the ferroelectric layer 18 corresponding to a second logic state as is known in the prior art. In this example, +3v is applied to gate electrode 20, and 0v is applied to source 12, drain 14, and substrate 10. Negative charges are attracted in channel region 16 putting this device in "inversion mode", thereby creating a potential in channel region 16 equal to the voltage of source 12 and drain 14, which are biased to 0v. Assuming that the coercive voltage is 3v or less, the electric field thereby created across the ferroelectric will polarize the ferroelectric layer 18 in the direction of that electric field. This electric field will have the effect of decreasing the turn-on threshold voltage of the ferroelectric FET.

FIG. 4 illustrates one example of a voltage bias applied to source 12, drain 14, gate electrode 18, and substrate 10 in order to detect the stored logic state, as is known in the prior art. In this example, +1.5v is applied to gate electrode 20, 0v is applied to source 12 and substrate 10, and 0.5v is applied to drain 14. Assuming that the electric field across ferroelectric layer 18 is less than the coercive voltage, the polarization of ferroelectric 18 is unchanged. A current will flow through source 12, channel 16, and drain 14, the magnitude of which depends on the turn-on voltage of the device. Since the turn-on threshold voltage corresponding to the first logic state is higher than for the second logic state, the magnitude of the current when the first logic state is stored is less than when the second logic state is stored.

When utilized in a memory array, additional transistors providing select functions must generally accompany each ferroelectric FET, thereby increasing the size of the memory array. It would, therefore, be desirable to provide an architecture and bias method of selecting a given ferroelectric FET within an array without requiring additional transistors.

SUMMARY OF THE INVENTION

According to the principles of the present invention, a method of writing a ferroelectric FET having source, drain, gate and substrate terminals and a ferroelectric layer between the gate and the substrate exhibiting hysteresis, forms a polarization in said ferroelectric layer to store first and second logic states such that a selection means is provided when arranged and connected in an array of rows and columns. The array of ferroelectric FETs is arranged in rows and columns, the gate terminal of ferroelectric FETs in the same row coupled to a common word line, the source terminal of ferroelectric FETs in the same row coupled to a common source line, the drain terminal of ferroelectric FETs in the same column coupled to a common bit line, the body terminal of ferroelectric FETs in the same array coupled to a common substrate terminal. A ferroelectric FET is selected for reading and writing within the array by application of bias voltages to the word line, source line, and bit line. To write the ferroelectric FET, a negative voltage whose magnitude is equal to or greater than the coercive voltage is applied to the word line, while ground potential (0v) is applied to the source line, the bit line, and the substrate. A positive voltage equal to or greater than the coercive voltage is then applied to the word line, while ground potential is applied to the source line and to the substrate, and a positive voltage equal to the voltage applied to the word line is applied to the bit line in order to store the first logic state or ground potential is applied to the bit line in order to store the second logic state. To read the ferroelectric FET, a positive voltage that is less than the coercive voltage is applied to the word line, while ground potential is applied to the source line and to the substrate, and a positive voltage less than or equal to the voltage applied to the word line is applied to the bit line.

DESCRIPTION OF THE DRAWINGS

FIGS. 5a–c are cross sectional diagrams illustrating the write cycle according to one embodiment of the present invention.

FIGS. 11a–d are cross sectional diagrams illustrating a portion of the write cycle according to one embodiment of the present invention.

FIGS. 12a–f are cross sectional diagrams illustrating the read bias according to one embodiment of the present invention.

FIGS. 13a–c are cross sectional diagrams illustrating a portion of the write cycle according to an alternative embodiment of the present invention.

FIGS. 14a–d are cross sectional diagrams illustrating a portion of the write cycle according to an alternative embodiment of the present invention.

FIGS. 15a–f are cross sectional diagrams illustrating the read bias according to an alternative embodiment of the present invention.

DETAILED DESCRIPTION OF THE INVENTION

Figure 1:
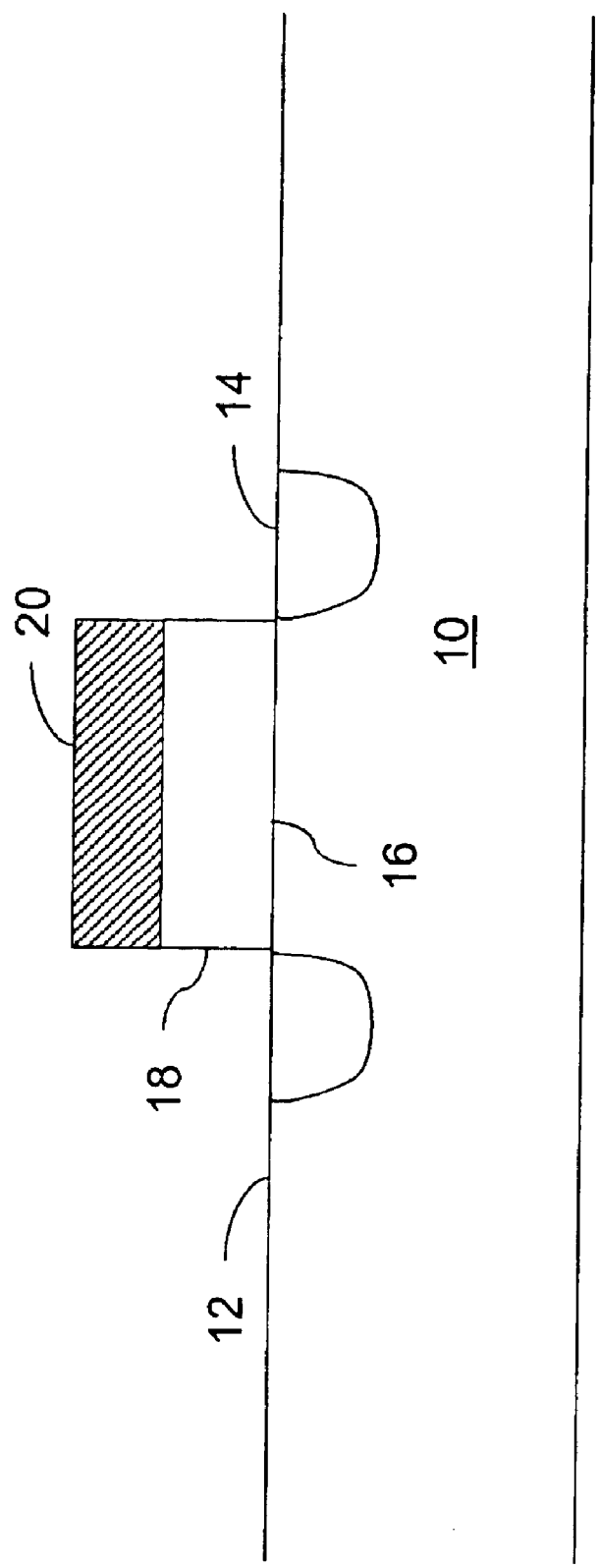
FIG. 1 is a cross sectional drawing showing prior art design of a ferroelectric FET.
Figure 2:
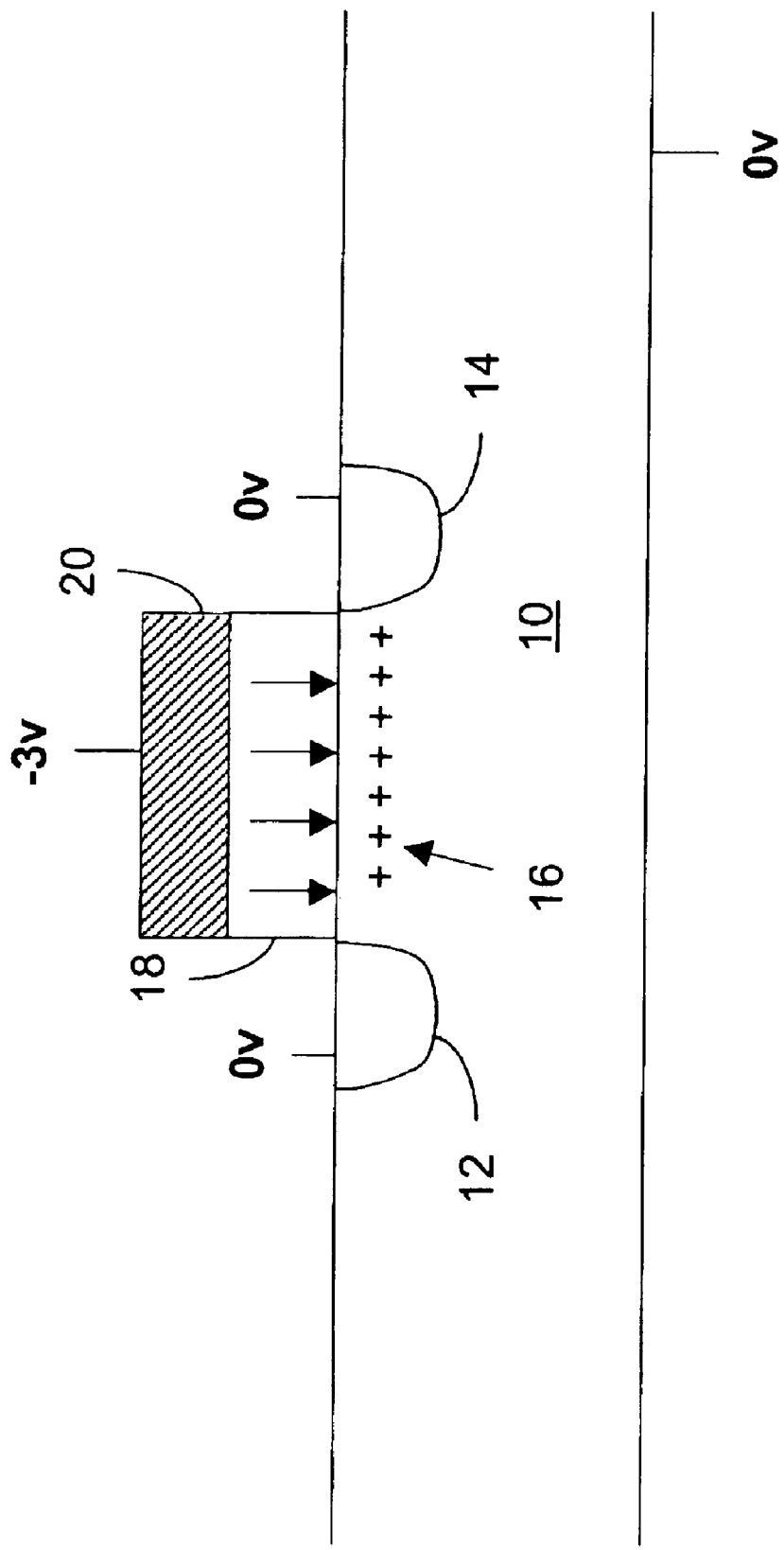
FIG. 2 is a cross sectional drawing showing prior art design of a ferroelectric FET biased to write a first polarization state.
Figure 3:
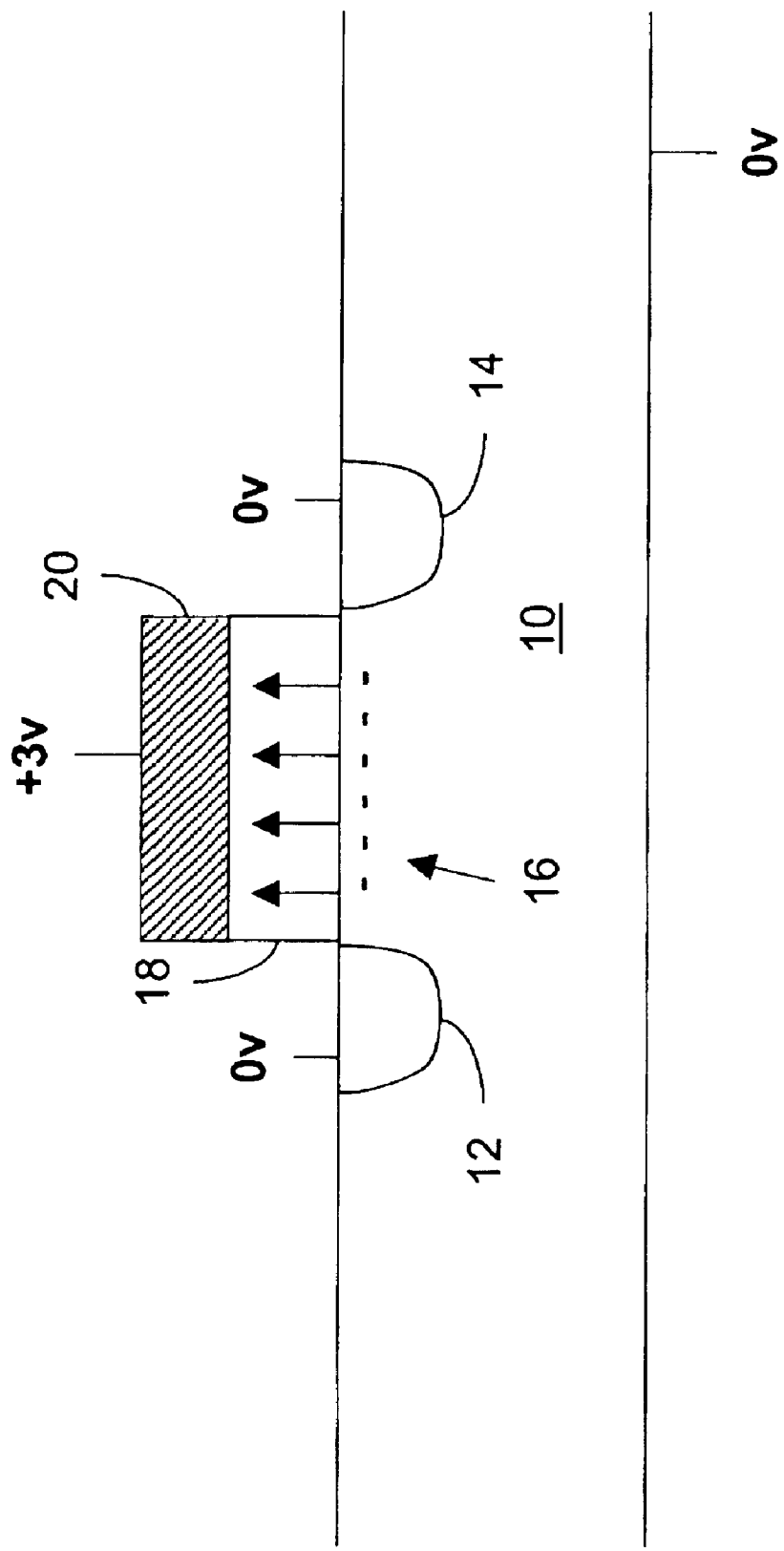
FIG. 3 is a cross sectional drawing showing prior art design of a ferroelectric FET biased to write a second polarization state.
Figure 4:
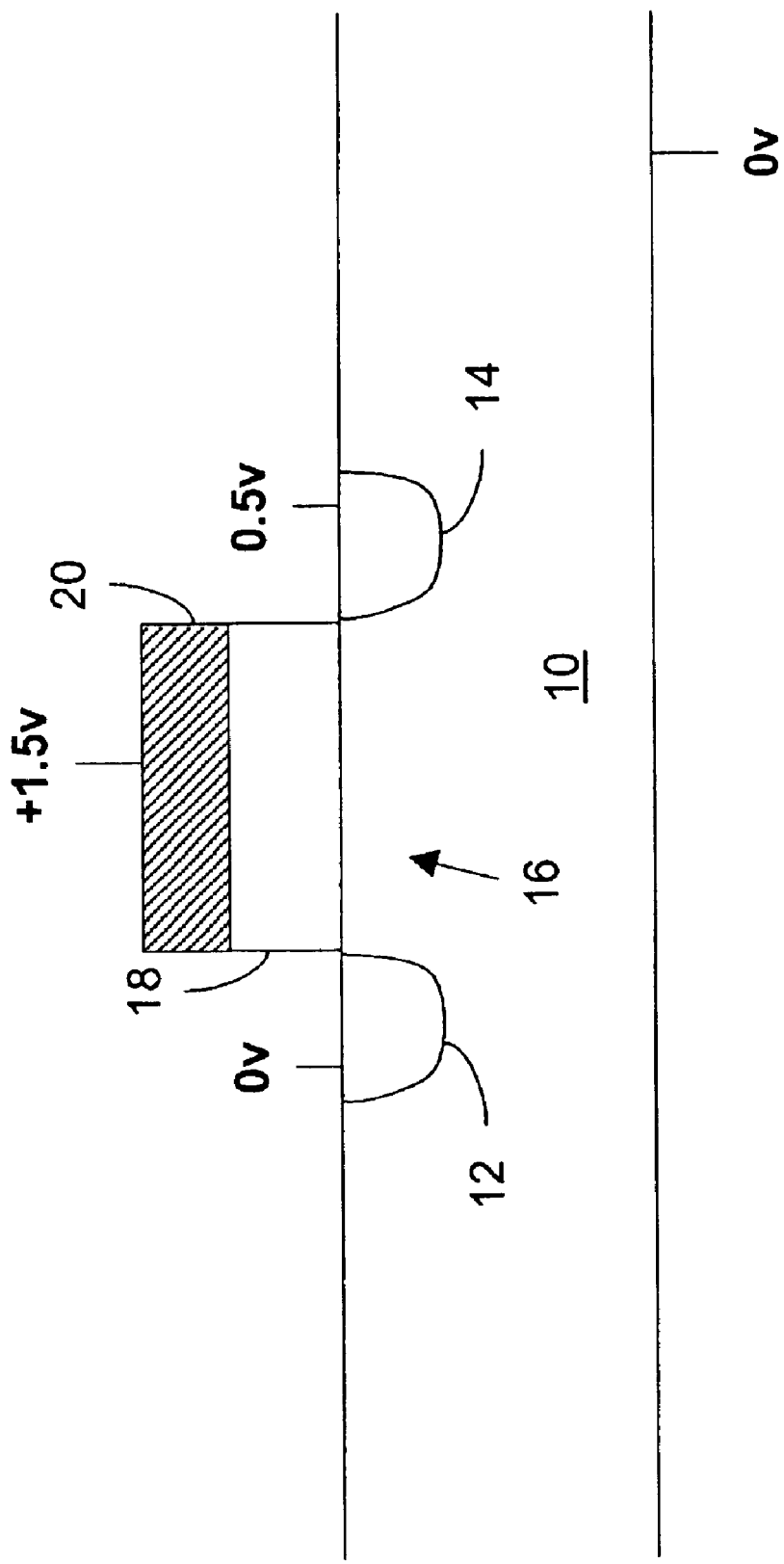
FIG. 4 is a cross sectional drawing showing prior art design of a ferroelectric FET biased to read the polarization state.

FIGS. 5a–c illustrate steps of one embodiment of a novel biasing scheme for writing a ferroelectric field effect transistor (FET) wherein two polarization states are stored in the ferroelectric layer of a single ferroelectric device. The ferroelectric FETs in FIGS. 5a–c are constructed on p-type semiconductor substrate 10 with two regions of n-type regions forming source 12 and drain 14, the region in between being channel region 16. A ferroelectric layer 18 is formed on the surface of channel region 16 and a conductive layer formed on the surface of ferroelectric 18 forms gate electrode 20. FETs 11, 13, 15 each illustrate different steps in the method. For the purposes of illustration, the coercive voltage of the ferroelectric layer of this ferroelectric FET is Vc, and is equal to 3v in this embodiment. However, the coercive voltage may be set to any desired voltage.

Writing data into the ferroelectric FET according to the present invention is a multi-step process. The initialization phase is independent of the data that is ultimately to be stored, and includes applying −3v on electrode 18, 0v on the source 12, drain 14, and substrate 10. FIG. 5a illustrates this step. Positive charges are now attracted to the channel region 16, placing this device in accumulated mode, thereby causing the channel region 16 to be at the voltage potential of the substrate 10, which is 0v. The polarization of the ferroelectric layer will align with the electric field. For the purposes of illustration, this polarization state will be defined as "arrow down", as shown in device 11 of FIG. 5a. The turn-on threshold voltage corresponding to the arrow down polarization state is defined as Vtd, and can be adjusted to any level by implanting the channel region with an appropriate threshold adjust implant. For the purposes of illustration, the turn on of the arrow down is equal to +1.5v in this embodiment.

A logic setting phase of the write process includes biasing of the ferroelectric device that depends on the data to be stored. FIGS. 5b–c illustrate alternative steps, depending on the desired logic state. Regardless of the data to be stored, +3v is applied to the gate electrode 20, 0v is applied to the source 12, and 0v is applied to the substrate 10.

If the ferroelectric FET is to store a first logic state, referred to in this embodiment as the "erased logic state", +3v is applied to the drain, as illustrated in FIG. 5b. Negative charges are now attracted to channel region 16, thereby forming an inversion layer in channel region 16. Therefore, the potential voltage in channel region 16 near the source will be the source voltage, or 0v, while the potential voltage near the drain region will be the drain voltage, or 3V.

Depending on the design of the device, the voltage potential across the channel region of a ferroelectric FET when the source and drain are at different voltages varies gradually across the channel, and about 50% of the voltage drops across the depletion region. For illustrative purposes to better understand the effects of this bias, it is useful to divide the ferroelectric layer into two imaginary halves, left ferroelectric layer 19 and right ferroelectric layer 21 as shown in FIGS. 5a–c. Referring now to device 13 of FIG. 5b, the voltage potential on the left ferroelectric layer 19 is now 3v, causing the polarization to change to the opposite state. For the purposes of illustration, this second polarization state will be defined as the "arrow up state", as shown in device 13 of FIG. 5b. The turn-on threshold voltage corresponding to this arrow-up polarization state is defined as Vtu. Voltage Vtu must be less than Vtd since the electric field created by the arrow up polarization now established will tend to turn on the ferroelectric FET. The precise threshold voltage is determined by a number of factors including threshold adjust implant, thickness of the ferroelectric layer, and the physics of the interface between the ferroelectric layer and the substrate. For the purposes of illustration, the turn-on voltage corresponding to the arrow up polarization state Vtu is assumed to be +0.5v. In the case of device 13 of FIG. 5b, the voltage across right ferroelectric layer 21 is 0v, a voltage less than the coercive voltage. Therefore, the polarization in right ferroelectric layer 21 remains unchanged from the polarization established previously, namely the arrow down polarization state with turn-on voltage Vtd, which is +1.5V.

If the ferroelectric FET is to store a second logic state, referred to in this embodiment as the "program logic state", then 0v is applied the drain. As before, the word line brought to +3v and the source is held to 0v. Negative charges are attracted to channel region 16, thereby forming an inversion layer in channel region 16. Therefore, the potential voltage in channel region 16 near the source and the drain is the same, 0v. Referring now to device 15 of FIG. 5c, the voltage potential on the left ferroelectric layer 19 and right ferroelectric 21 is 3v, causing the polarization to change to the arrow up polarization state. Both left ferroelectric layer 19 and right ferroelectric 21 are no w in the up arrow polarization state. The turn-on threshold voltage corresponding to this programmed state is Vtu, equal to 0.5v. Table 1 is a table that summarizes the voltages that have been defined.

TABLE 1

| State | Polarization State | Threshold Voltage |
|---|---|---|
| Coercive Voltage | | Vc = 3 v |
| Erase Logic State | ARROW DOWN | Vte = 1.5 v |
| Program Logic State | ARROW UP | Vtp = 0.5 v |

Notice that the left ferroelectric layer 19 is now polarized to an arrow up state, regardless of what logic state was stored in the ferroelectric FET. If the ferroelectric FET was written to an erased logic state, right ferroelectric layer 21 is now polarized to a down arrow state, as shown in device 25 of FIG. 6a. On the other hand, if the ferroelectric FET was written to a programmed logic state, right ferroelectric layer 21 is now polarized to an up arrow state, as shown in device 27 of FIG. 6b.

Figure 6A:
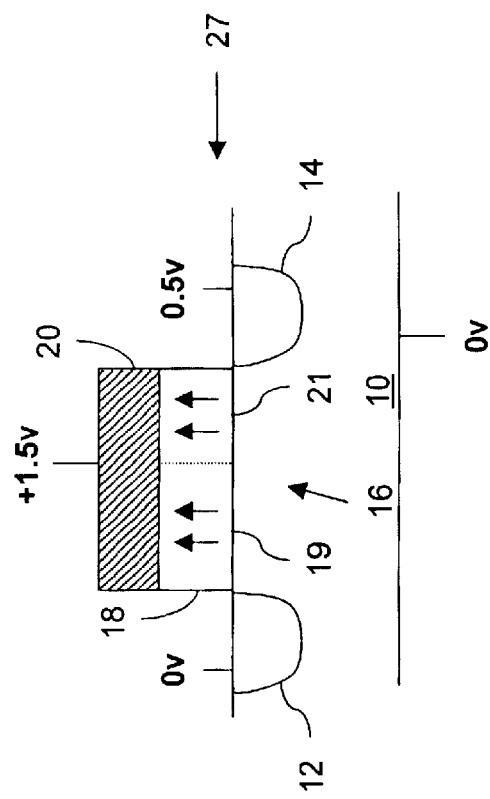
FIGS. 6a–b are cross sectional diagrams illustrating the read bias according to one embodiment of the present invention.
Figure 6B:
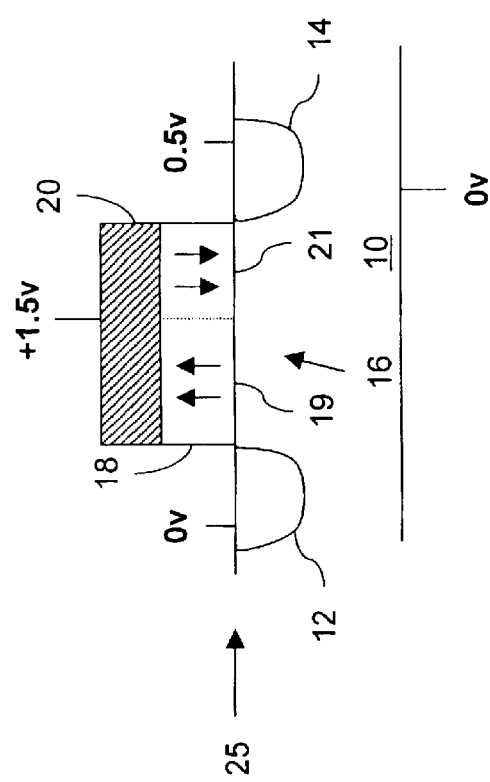

FIGS. 6a–b illustrates the bias on the ferroelectric FET utilized to detect the stored logic states. To readily understand the effect of this bias, it is useful to think of this ferroelectric FET as two devices in series, one device formed by left ferroelectric layer 19 and the other device formed by right ferroelectric 21. For purposes of illustration, the device formed by the left ferroelectric 19 will be defined as the "selection device 19" and the device formed by the right ferroelectric 21 will be defined as the "data device 21".

Referring now to device 25 of FIG. 6a, corresponding to an erased logic state, the polarization of the select device 19 is arrow up and the polarization of the data device 21 is arrow down. Therefore, in keeping with the previously defined turn-on threshold voltages, 0.5v for the up arrow polarization and 1.5v for the down arrow polarization, the select device 19 is turned on while the data device 21 is off.

Referring now to device 27 of FIG. 6b, corresponding to a programmed logic state, the polarization of both the select device 19 and the data device 21 is the arrow up state. Therefore, both the select device 19 and the data device 21 are turned on. Consequently, there is significantly more current flowing in channel 16, and therefore through the drain, when the ferroelectric FET stores a programmed state than when the ferroelectric FET stores an erased state. This difference in current through the drain is utilized to detect which polarization state is stored.

Summarizing this embodiment, to write a logic state, a negative voltage is applied to gate 20. Ground potential is applied to source 12, drain 14, and substrate 10. The negative voltage has a magnitude at least equal to the coercive voltage of the FET. A positive voltage is then applied to gate 20. Ground potential is applied to source 12 and substrate 10. The positive voltage is no less than the coercive voltage. Either a positive voltage or a ground potential is applied to drain 14 to write a logic state to the FET.

To read the logic state, a voltage is applied to gate 20. Ground potential is applied to source 12. A positive voltage is applied to drain 14. The voltage applied to gate 20 is less than the coercive voltage and at least equal to the voltage applied to drain 14. A drain current is measured and compared to a compare current. The relative size of the drain current compared to the compare current is indicative of the stored logic state in the FET.

Figure 7:
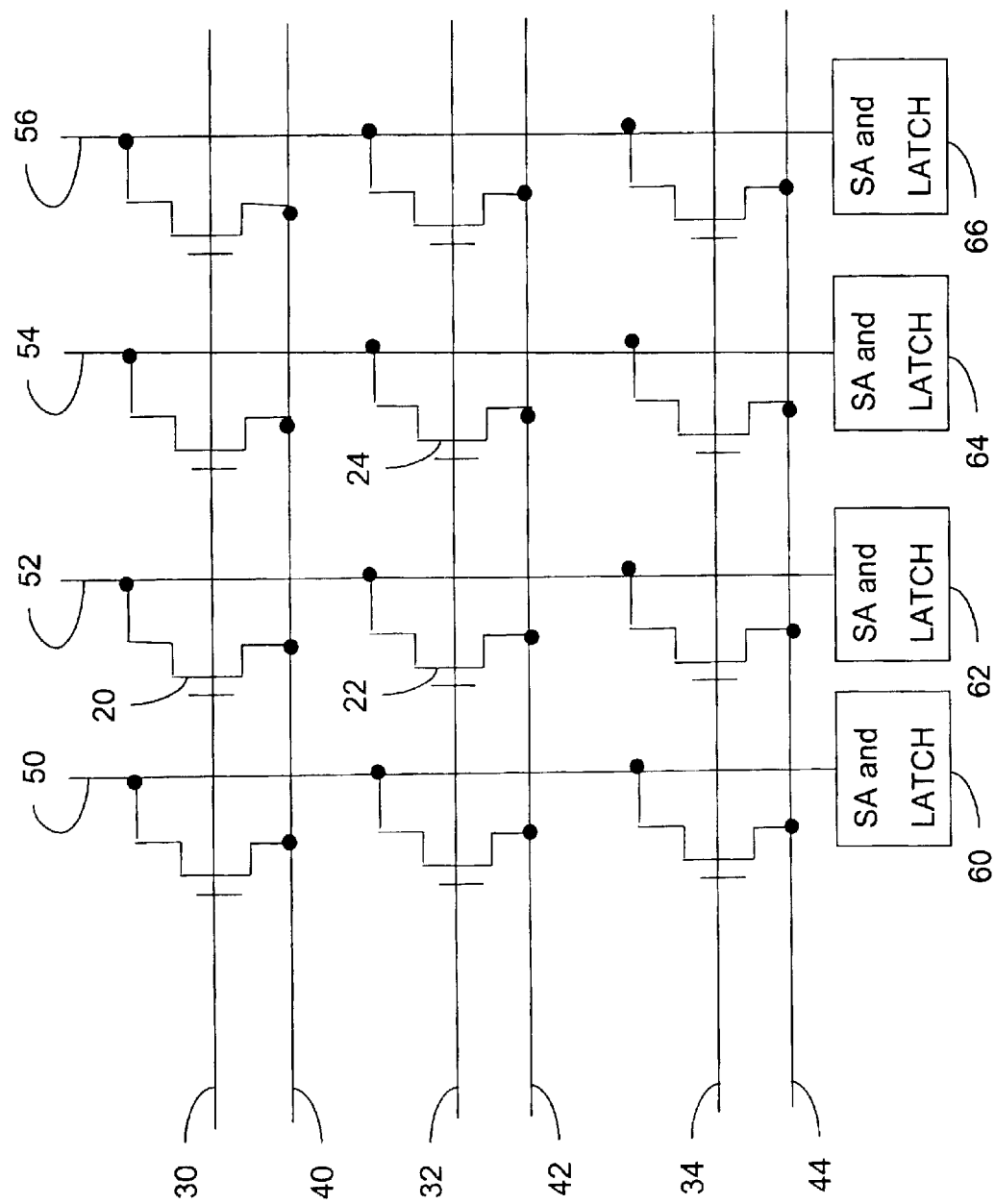
FIG. 7 is a schematic diagram of an array of ferroelectric FETs according to one embodiment of the present invention.

FIG. 7 is a schematic diagram that illustrates an arrangement of ferroelectric FETs in another embodiment of the present invention. Ferroelectric FETs are arranged in rows and columns. The gates of all ferroelectric FETs in any single row are connected to a common word line. For example, the gates of ferroelectric FET 22 and 24 are connected to word line 32. The sources of all ferroelectric FETs in a single row are connected to a common source line. For example, the sources of ferroelectric FET 22 and 24 are connected to source line 42. The drains of all ferroelectric FETs in any single column are connected to a common bit line. For example, ferroelectric FET 20 and 22 are connected to bit line 52. A sense amp and a latch are coupled to each bit line. For example, latch 60 is coupled to bit line 50, latch 62 is coupled to bit line 52, latch 64 is coupled to bit line 54, and latch 66 is coupled to bit line 56.

Figure 8:
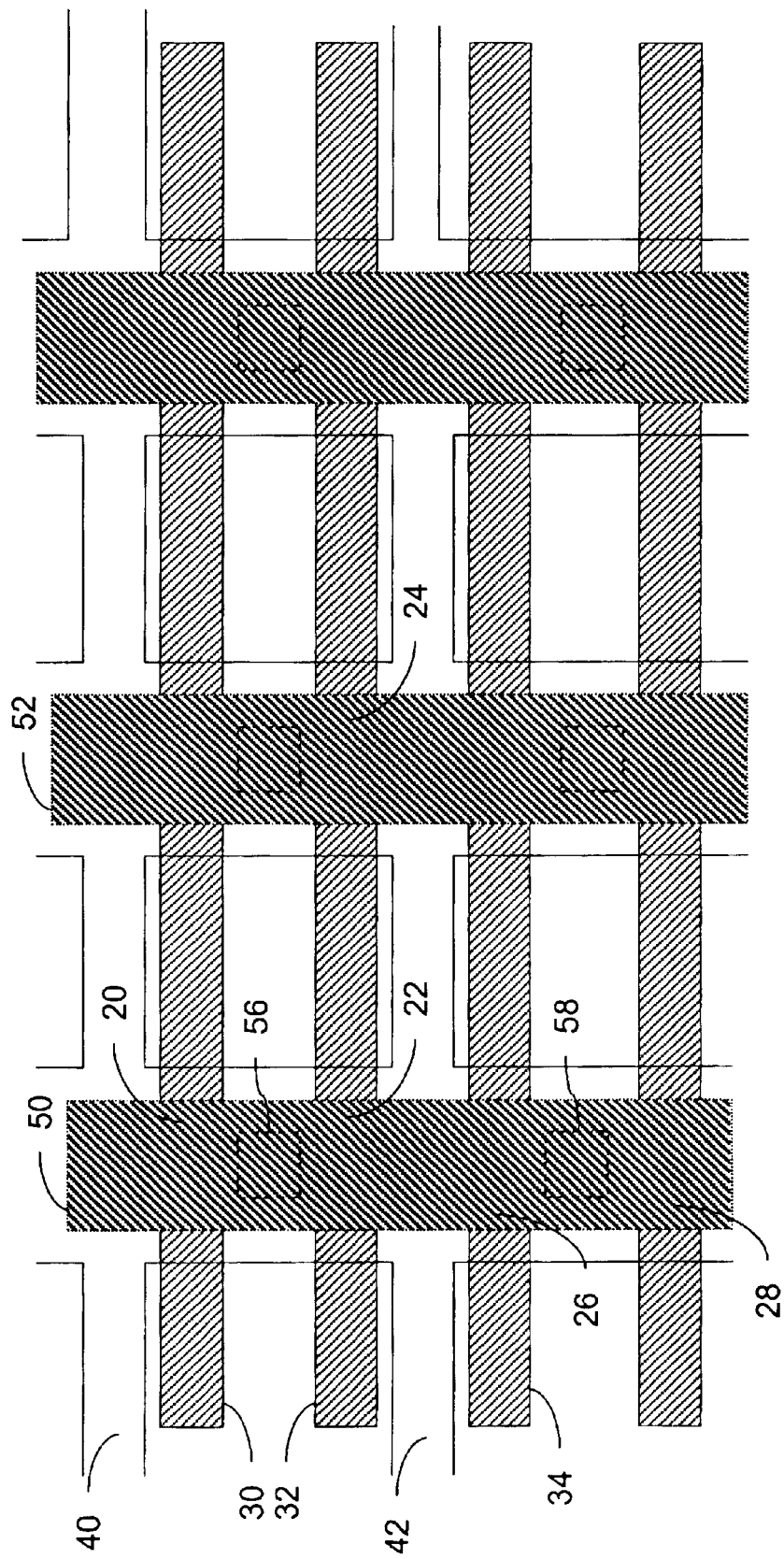
FIG. 8 is a planar view diagram of the array of ferroelectric FET in FIG. 7.

FIG. 8 is a planar diagram of the above-described array of ferroelectric FETs. The numbers in FIG. 7 correspond to the same numbers in FIG. 8 for the same elements. A polysilicon word line 32 forms the gates of ferroelectric FET 22 and 24. A diffused source line 42 forms the sources of ferroelectric FET 22 and 24. Another diffused source line 40 forms the source of ferroelectric FET 20. Metal bit line 50 makes contact to the drains of ferroelectric FET 20 and 22 via contact hole 56 and to ferroelectric FET 26 and 28 via contact hole 58.

Figure 9:
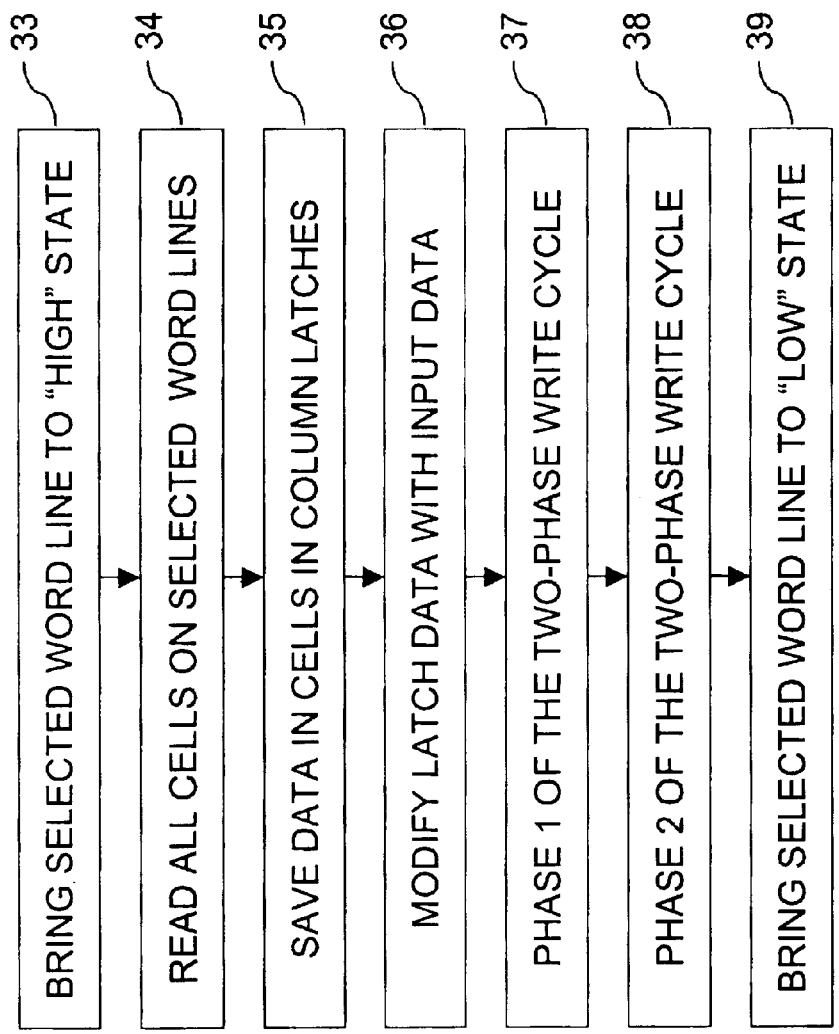
FIG. 9 is a flow chart illustrating one embodiment of the method of the present invention for writing the ferroelectric array of FIG. 7.

FIG. 9 is a flow chart illustrating the one embodiment of the process of entering data into the memory array. This process utilizes the above-described write cycle. At the beginning of a write cycle, all ferroelectric FETs whose gates are coupled to the selected word line, for example word line 32, are read (34). The data of each ferroelectric FET is then saved (35) in the latch that is coupled to its drain via the bit line. For example, data in ferroelectric FET 22 is saved in latch 62 via bit line 52, while data in ferroelectric FET 24 is saved in latch 64 via bit line 54. The data in the latches are then overwritten (36) with new input data as required. All ferroelectric FETs along the selected word line are now erased (37) by applying −3v on the selected word line, 0v on the bit lines and 0v on the source line. When the erase is complete, the selected word line is brought to +3v and the bit lines are then biased at 0v or +3v (38), depending on the data in the corresponding latch. The ferroelectric FETs along the selected word line are thereby written to the appropriate data state. The biasing of the selected ferroelectric FETs and the deselected ferroelectric FETs within the array will now be explored.

Figure 10A:
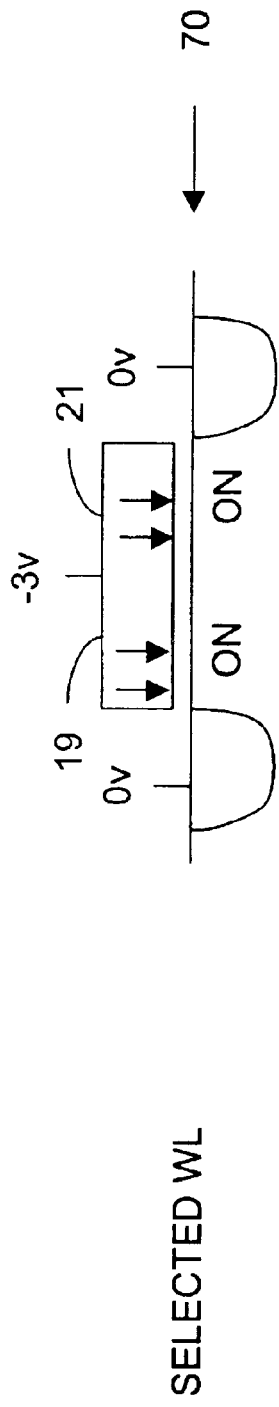
FIGS. 10a–b are cross sectional diagrams illustrating a portion of the write cycle according to one embodiment of the present invention.
Figure 10B:
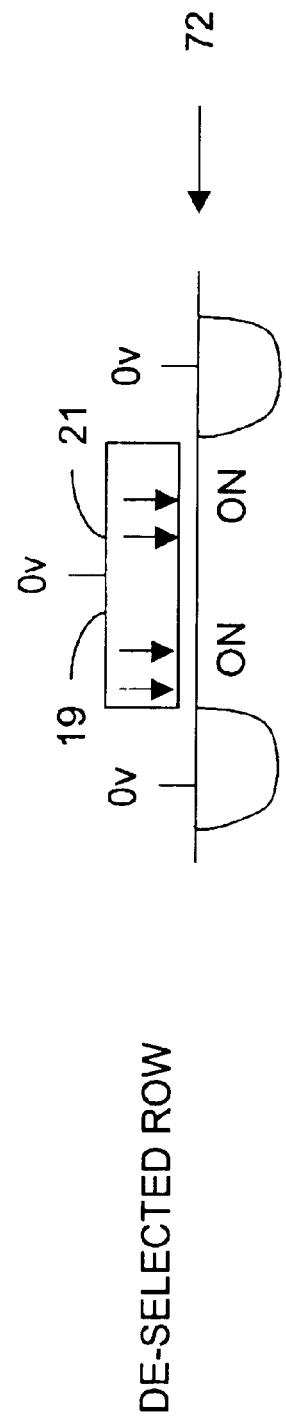

FIGS. 10a–b illustrate the bias of ferroelectric FETs within the array on selected and deselected word lines during the initialization phase of the write process. The gates of ferroelectric FETs along the selected word line are forced to −3v, and all bit lines and source lines are at 0v, as shown in device 70 of FIG. 10a. In this case, both the left ferroelectric layer 19 and right ferroelectric 21 are written to the up arrow state of polarization. The voltage on the deselected word lines is 0v, as shown in device 72 of FIG. 10b. Since the bit line and the source line is also at 0v, the potential across the ferroelectric layer is 0v, leaving the polarization state of left ferroelectric layer 19 and right ferroelectric layer 21 unchanged.

FIGS. 11a–d illustrate the bias of ferroelectric FETs within the array on selected and deselected word lines during the logic setting phase of the write process. Device 81 of FIG. 11a illustrates the bias on a ferroelectric FET along the selected word line when storing the erase logic state into the ferroelectric FET. The word line is brought to +3v, the source is at 0v, and the bit line is brought to 3v. The coercive voltage is reached across left ferroelectric layer 19, thereby writing left ferroelectric layer 19 to the arrow up polarization state. The voltage potential across right ferroelectric layer 21 is 0v, leaving the polarization therein unchanged from the arrow down polarization state established previously.

Device 82 of FIG. 11b illustrates the bias along the selected word line writing the programmed logic state into the ferroelectric FET during the logic setting phase of the write process. In this case, the bit line is brought to 0v, thereby causing a voltage potential of 3v across right ferroelectric layer 21. Right ferroelectric 21 is, therefore, written to an arrow up polarization state.

Devices 83 and 84 of FIGS. 11c–d illustrate the bias of ferroelectric FETs within the array on a deselected word line during the logic setting phase of the write process. Since deselected word lines are at 0v and the source lines are at 0v, the voltage potential across the left ferroelectric layer 19 is 0v, leaving the polarization state unchanged. The bit line will be at 0v or 3v, depending on the data being written into the selected ferroelectric FET along that bit line. Device 83 of FIGS. 11c shows the bias of the ferroelectric FET in the case where the bit line is 0v. 0v is across right ferroelectric layer 21, thereby leaving the polarization therein unchanged. Device 84 of FIGS. 11d is marked with the bias conditions of the other case wherein the bit line is at 3v. This device is turned off, and so the channel region is l the potential of the substrate, which is at 0v. Therefore, the voltage potential across right ferroelectric 21 in this case is 0v, leaving the polarization therein unchanged.

Consequently, it is shown that the write operation when applied to the array will write an erased logic state into a ferroelectric FET along a selected word line when the bit line is brought to 3v and a programmed state when the bit line is brought to 0v, while leaving stored polarization in all ferroelectric FETs in a deselected word line unchanged.

Detecting the stored polarization is accomplished in the read cycle, based on detecting a difference in the current through the bit line between a ferroelectric FET storing an erased and a programmed logic state. During the read cycle, the selected word line is brought to +1.5v, the source line is at 0v, and the bit line is brought to 0.5v. This bias condition is shown in device 90 and 91 of FIGS. 12a–b for a stored erased logic state and a stored programmed logic state, respectively. In keeping with the write cycles above-described, when an erased logic state is stored in the ferroelectric FET, then left ferroelectric layer 19 is polarized to an arrow up polarization state and right ferroelectric layer 21 is polarized to an arrow down polarization state, corresponding to turn-on threshold voltages 0.5v and 1.5v, respectively. Therefore, data device 21 having the arrow down polarization state stored in right ferroelectric layer 21 is off, and only small subthreshold current will flow through the ferroelectric device and through the bit line. When a programmed logic state is written into the ferroelectric FET, then both ferroelectric layer 19 and 21 are written to an arrow up polarization state, corresponding to a turn-on voltage of 0.5v. Therefore, both the select device 19 having left ferroelectric layer 19 and the data device 21 having right ferroelectric layers 21 are turned on. Consequently, significantly more current flows through the ferroelectric FET and through the associated bit line when a programmed logic state is stored in the ferroelectric FET than when an erased logic state is stored.

Deselected word lines during the read cycle are held at 0v. Since the bit lines are at 0.5v, the deselected cell during a read will have 0v on the gate electrode, 0v on the source, and 0.5v on the drain, as shown in devices 93 and 94 of FIG. 12c–d. Regardless of the data state stored, the device having left ferroelectric layer 19 is turned off. Therefore, no current will flow on the bit line due to a deselected ferroelectric FET.

In the above-presented embodiment, all ferroelectric FETs along the selected word line are read, and the data is stored in the associated latch and coupled to output lines as appropriate. In this addressing architecture, all ferroelectric cells along the selected word line are selected for read out as far as the memory array is concerned. It is also possible in a variation of this embodiment to select one or more individual ferroelectric FETs along the selected word line, while leaving the polarization states of deselected ferroelectric FETs unchanged. In this embodiment, only bit lines associated with selected ferroelectric cells are brought to 0.5v. The bit lines associated with deselected ferroelectric FET will be held to 0v. Deselected ferroelectric FETs along the selected word line will now be biased with 1.5v on the gate electrode and 0v on the source and drain, as shown in devices 95 and 96 of FIGS. 12e–f. Though this bias will turn on the ferroelectric FET, no current will flow through the bit line since the bit line and the source are both at 0v.

In an alternative embodiment, the threshold implant, the ferroelectric thickness, and other properties of the ferroelectric FET are adjusted such that the turn-on thresholds for the arrow down polarization are +1.5v and the turn-on threshold for the arrow up polarization is at −1.5v. The coercive voltage is assumed to be 3v. These voltages are summarized in Table 2. With these turn-on voltages, the arrow up polarization state is now a depletion device.

TABLE 2

| State | Polarization State | Threshold Voltage |
| --- | --- | --- |
| Coercive Voltage | | Vc = 3 v |
| Erase Logic State | ARROW DOWN | Vte = +1.5 v |

TABLE 2-continued

| State | Polarization State | Threshold Voltage |
| --- | --- | --- |
| Program Logic State | ARROW UP | Vtp = −1.5 v |

In this embodiment, to write a logic state in an individual ferroelectric FET, a negative voltage is applied to gate 20 and ground potential to source 12, drain 14, and substrate 10 during an initialization phase of the write process. The negative voltage has a magnitude at least equal to a coercive voltage of the FET. In the logic setting phase of the write process, a positive voltage is then applied to gate 20, ground potential is applied to the substrate and a positive voltage is applied to source 12. The positive voltage applied to gate 20 is at least equal to the coercive voltage of the FET. The positive voltage applied to source 12 is at least equal to the positive voltage applied to gate 20. Therefore, the polarization of left ferroelectric layer 19 in selection device 19 remains unchanged from the state set during the initialization phase of the write process, the arrow down state.

Either a positive voltage or ground potential is applied to drain 14 to write a logic state to the FET, depending on the desired logic state. The positive voltage is about equal to the positive voltage applied to gate 20.

To read the logic state of an individual ferroelectric FET, a voltage is applied to gate 20, ground potential is applied to source 12, and a positive voltage is applied to drain 14. A drain current is measured through drain 14. The drain current is compared to a compare current. The drain current being larger or smaller than the compare current is indicative of a stored logic state in the FET.

The memory array configuration and the steps involved in writing the ferroelectric FETs are the same as in the above-described embodiment. However, the biasing of the ferroelectric FET is now different in order to take into account the depletion device formed when an arrow up polarization state is stored in the ferroelectric layer.

The initialization phase of the write operation is identical to the previously described embodiment. The selected word line is brought to −3v, the source line and bit lines are held at 0v, as shown in device 101 of FIG. 13a. Both the left ferroelectric layer 19 and the right ferroelectric layer 21 are polarized to a down arrow polarization. Devices 102 and 103 show the bias of the ferroelectric FETs on the deselected word lines. Since word line, bit line and source line are all at 0v, there is no electric field applied across the ferroelectric layer, thereby leaving the polarization state stored in the ferroelectric layer unchanged.

FIGS. 14a–d illustrates the bias on the ferroelectric FET during the logic setting phase of the write operation. The selected word line is brought to +3v. In addition, all source lines are brought to +3v. The bit line voltage depends on the data that is to be written into the ferroelectric FET. In order to program an erased logic state, the bit line is brought to +3v, as shown in device 110 of FIG. 14a. The voltage across left ferroelectric layer 19 and right ferroelectric layer 21 is 0v, thereby leaving the polarization states unchanged. Since these layers were written to a down arrow polarization state previously in the write operation, left ferroelectric layer 19 and right ferroelectric 21 will remain in a down arrow polarization state for the erased logic state.

Device 111 of FIG. 14b shows the bias on the ferroelectric FET to write a programmed logic state. The bit line is held at 0v, creating a voltage across right ferroelectric layer 21 sufficient to switch polarization to an arrow up state. Ferroelectric FETs along deselected word lines are biased as shown in devices 112 and 113 of FIGS. 14c–d. The word line and the bit line are held at 0v, thereby leaving the polarization stored in right ferroelectric layer 21 unchanged. The source line is brought to +3v. This device is turned off, the channel region therefore being at the same electrical potential as the substrate. Since the substrate and the gate electrode at the same potential, 0v, the polarization state within the ferroelectric layer remains unchanged.

Devices 120 and 121 of FIGS. 15a–b illustrate the bias on selected ferroelectric FETs to sense the polarization stored. The selected word line is brought to +1.5v, the source line is held at 0v, and the bit line is brought to +0.5v. In keeping with the above-described write cycle, left ferroelectric layer 19 and right ferroelectric layer 21 are written to an arrow down polarization when an erased logic state is written into the ferroelectric FET, as shown in device 120 of FIGS. 15a. The current through the ferroelectric FET, and therefore through the bit line, can be viewed as two devices in series, each having a turn-on voltage of +1.5v. If a programmed logic state is written into the ferroelectric FET, then right ferroelectric layer 21 is polarized to an arrow up state corresponding to a turn-on voltage of −1.5v, as shown in FIG. 15b. The current through the ferroelectric FET and through the bit line is therefore higher when a programmed logic state is written into the ferroelectric FET than when an erased logic state is written into the ferroelectric FET.

Deselected word lines during the read cycle are held at 0v. Since the bit lines are at 0.5v, the deselected ferroelectric FET during a read will have 0v on the gate electrode, 0v on the source, and 0.5v on the drain, as shown in devices 124 and 125 of FIGS. 15b–c. Regardless of the data state stored, select device 19 having left ferroelectric layer 19 is turned off. Therefore, no current will flow on the bit line due to a deselected device.

In the above-presented embodiment, all ferroelectric FETs along the selected word line are read and stored in a corresponding latch. The data of some of these latches may now be coupled to the output pins of the memory as appropriate. In this addressing scheme, all ferroelectric cells along the selected word line are selected for read out from the array.

It is possible in a variation of this embodiment to select one or more individual ferroelectric FETs along the selected word line without changing the polarization state of the deselected FETs along the selected word line, thereby saving power. In this embodiment, only bit lines associated with selected ferroelectric cells are brought to 0.5v. The bit lines associated with deselected ferroelectric FET will be held to 0v. Deselected ferroelectric FETs along the selected word line will now be biased with 1.5v on the gate electrode and 0v on the source and drain, as shown in devices 122 and 123 of FIGS. 15e–f. Though this bias will turn on the ferroelectric FET, no current will flow through the bit line since the bit line and the source are both at 0v.

The foregoing description is only illustrative of the invention. Various alternatives and modifications can be devised by those skilled in the art without departing from the invention. In particular, though specific turn-on threshold voltages and coercive voltages were assumed in the embodiments, any turn-on threshold voltage or coercive voltage is within the scope of this invention. Though reference was made to a specific ferroelectric FET structure, this invention applies to all ferroelectric FET structures including those with one or more dielectric layers between the ferroelectric layer and the semiconductor substrate, one or more dielectric layers between the ferroelectric layer and the electrode layer, or an encapsulation layer over or below the electrode layer. The ferroelectric layer can include any material exhibiting hysteresis. The electrode can be any conductive or semiconductor material. Though reference is made in the embodiment to a ferroelectric built on p-type substrate with an n-type source and drain, ferroelectric structures built on n-type substrate with a p-type source and drain are within the scope of the present invention. Though the embodiments make reference to ferroelectric FETs with a continuous ferroelectric layer, a dielectric spacer can be placed between the portion of the ferroelectric gate layer close to the source and the portion of the ferroelectric close to the drain within the scope of this invention. Accordingly, the present invention embraces all such alternatives, modifications, and the scope of the appended claims.

What is claimed is:

1. A method for interacting with a ferroelectric field effect transistor (FET) exhibiting hysteresis having a gate, source, drain, and substrate, the method comprising:
   (a) applying a negative voltage to the gate and ground potential to the source, drain, and substrate, the negative voltage having a magnitude at least equal to a coercive voltage of the FET;
   (b) applying a positive voltage to the gate and ground potential to the source and the substrate, the positive voltage having a magnitude at least equal to the coercive voltage; and
   (c) selectively applying either a positive voltage or a ground potential to the drain to write a logic state to the FET, the positive voltage about equal to the positive voltage applied to the gate.

2. The method of claim 1 further including:
   (a) applying a voltage to the gate, ground potential to the source, and a positive voltage to the drain, the voltage applied to the gate less than the coercive voltage and at least equal to the voltage applied to the drain;
   (b) measuring the drain current through the drain; and
   (c) comparing the drain current to a compare current, the drain current being larger or smaller than the compare current indicative of a stored logic state in the FET.

3. The method of claim 2 wherein the compare current has a magnitude between a magnitude of the drain current resulting when a positive voltage is applied to the drain and a magnitude of the drain current resulting when ground potential is applied to the drain.

4. A method for interacting with a selected ferroelectric field effect transistor (FET) in an array of ferroelectric FETs, each ferroelectric FET in the array having a gate, source, drain, substrate, and ferroelectric layer, the array arranged in rows and columns, the gate of each ferroelectric FETs in the same row coupled to a word line, the source of each ferroelectric FETs in the same row coupled to a source line, the drain of each ferroelectric FETs in the same column coupled to a bit line, the method comprising:
   (a) applying a negative voltage to the word line of the selected FET and ground potential to the source line, bit line, and substrate of the selected FET, the negative voltage having a magnitude at least equal to a coercive voltage of the FET;
   (b) applying a positive voltage to the word line of the selected FET and ground potential to the source line and the substrate of the selected FET, the positive voltage having a magnitude at least equal to the coercive voltage; and
   (c) selectively applying either a positive voltage or a ground potential to the bit line of the selected FET to write a logic state to the selected FET, the positive voltage having a magnitude about equal to the magnitude of the positive voltage applied to the word line.

5. The method of claim 4 further comprising:
   (a) applying a voltage to the word line of the selected FET, ground potential to the source line and the substrate of the selected FET, and a positive voltage to the bit line of the selected FET, the voltage applied to the word line of the selected FET less than the coercive voltage and at least equal to the voltage applied to the bit line of the selected FET;
   (b) measuring the bit current of the bit line of the selected FET; and
   (c) comparing the bit line current to a compare current, the bit line current being larger or smaller than the compare current indicative of a stored logic state in the selected FET.

6. The method of claim 4 further comprising:
   (a) applying a voltage to the word line of the selected FET, ground potential to the source line and the substrate of the selected FET, and a positive voltage to the bit line of the selected FET, the voltage applied to the word line of the selected FET less than the coercive voltage and at least equal to the voltage applied to the bit line of the selected FET;
   (b) measuring the bit voltage of the bit line of the selected FET; and
   (c) comparing the bit line voltage to a compare voltage, the bit line voltage being larger or smaller than the compare voltage indicative of a stored logic state in the selected FET.

7. The method of claim 5 wherein the compare current has a magnitude between a magnitude of the drain current resulting when a positive voltage is applied to the bit line and a magnitude of the drain current resulting when ground potential is applied to the bit line.

8. A method as in claim 5 wherein each bit line of the array has an associated column latch and further comprising saving the logic state of the FET in the associated column latch of the bit line of the selected FET.

9. A method of interacting with a ferroelectric field effect transistor (FET) having a gate, source, drain, substrate, and a ferroelectric layer, the method comprising:
   (a) applying a negative voltage to the gate and ground potential to the source, drain, and substrate, the negative voltage having a magnitude at least equal to a coercive voltage of the FET; and
   (b) applying a positive voltage to the gate, ground potential to the substrate and the source, the positive voltage applied to the gate at least equal to a coercive voltage of the FET; and
   (c) selectively applying either a positive voltage or ground potential to the drain to write a logic state to the FET, the positive voltage about equal to the positive voltage applied to the gate.

10. The method of claim 9 further including:
    (a) applying a voltage to the gate, ground potential to the source, and a positive voltage to the drain, the voltage applied to the gate less than the coercive voltage and at least equal to the voltage applied to the drain;
    (b) measuring the drain current through the drain; and
    (c) comparing the drain current to a compare current, the drain current being larger or smaller than the compare current indicative of a stored logic state in the FET.

11. A method of interacting with a ferroelectric field effect transistor (FET) having a gate, source, drain, substrate, and a ferroelectric layer, the method comprising:

(a) applying a negative voltage to the gate and ground potential to the source, drain, and substrate, the negative voltage having a magnitude at least equal to a coercive voltage of the FET, and (b) applying a positive voltage to the gate and ground potential to the substrate, the positive voltage applied to the gate at least equal to a coercive voltage of the FET; and (c) selectively applying either a positive voltage or ground potential to each of the source and the drain to write a logic state to the FET, the positive voltage applied to the drain about equal to the positive voltage applied to the gate, the positive voltage applied to the source at least equal to the positive voltage applied to the gate.

12. A method for interacting with a selected ferroelectric field effect transistor (FET) in an array of ferroelectric FETs, each ferroelectric FET in the array having a gate, source, drain, substrate, and ferroelectric layer, the array arranged in rows and columns, the gate of each ferroelectric FETs in the same row coupled to a word line, the source of each ferroelectric FETs in the same row coupled to a source line, the drain of each ferroelectric FETs in the same column coupled to a bit line, the method comprising:

(a) applying a negative voltage to the word line of the selected FET and ground potential to the source line, bit line, and substrate of the selected FET, the negative voltage having a magnitude at least equal to a coercive voltage of the FET;

(b) applying a positive voltage to the word line of the selected FET and ground potential to the substrate of the selected FET, the positive voltage applied to the word line having a magnitude at least equal to the coercive voltage; and (c) selectively applying either a positive voltage or a ground potential to each of the source line and bit line of the selected FET to write a logic state to the selected FET, the positive voltage applied to the source line having a magnitude at least equal to the coercive voltage, the positive voltage applied to the bit line having a magnitude about equal to the magnitude of the positive voltage applied to the word line.

* * * * *